United States Patent [19]

Iesaka et al.

[11] Patent Number: 4,476,481

[45] Date of Patent: Oct. 9, 1984

[54] LOW-LOSS P-I-N DIODE

[75] Inventors: Susumu Iesaka, Tokyo; Shigenori Yakushiji, Yokohama, both of Japan

[73] Assignee: Tokyo Shibaura Denki Kabushiki Kaisha, Japan

[21] Appl. No.: 384,649

[22] Filed: Jun. 3, 1982

[30] Foreign Application Priority Data

Aug. 31, 1981 [JP] Japan ................. 56-136773

[51] Int. Cl.³ .................................. H01L 29/12
[52] U.S. Cl. ........................ 357/58; 357/63; 357/90; 357/88
[58] Field of Search .................. 357/58, 63, 90, 88

[56] References Cited

U.S. PATENT DOCUMENTS

| | | | |
|---|---|---|---|
| 2,843,516 | 7/1958 | Herlet | 357/88 |
| 3,640,783 | 2/1972 | Bailey | 357/63 |
| 3,984,858 | 10/1976 | Cornu et al. | 357/58 |
| 4,149,906 | 4/1979 | De La Moneda | 357/90 |
| 4,410,902 | 10/1983 | Malik | 357/58 |

*Primary Examiner*—Martin H. Edlow
*Assistant Examiner*—W. Mintel
*Attorney, Agent, or Firm*—Finnegan, Henderson, Farabow, Garrett & Dunner

[57] ABSTRACT

A low-loss P-i-n diode includes an i-type layer consisting of first and second i-type regions formed on the cathode layer of the diode and the i-type has a thickness $W_i$ of less than 25 μm. The impurity concentration of the first i-type region is higher than that of the second i-type region. To obtain a good forward-voltage $V_f$, $W_i^2/\tau$ is selected to be in the range of 20–200 cm²/sec and the carrier lifetime $\tau$ of the i-type layer is controlled by a carrier lifetime killer with a small resistivity compensation effect which is diffused into the i-type layer. The P-i-n diode has a high reverse breakdown voltage, small forward-voltage drop and a short recovery time.

5 Claims, 14 Drawing Figures

LOW-LOSS P-I-N DIODE

BACKGROUND OF THE INVENTION

1. Field of the Invention

This invention relates to a P-i-n diode, and more particularly to the fabrication and structure of the intrinsic region (i-region) of the P-i-n diode.

2. Description of the Prior Art

The conventional P-i-n diode includes an n+ type cathode layer, an i-type layer, a p-type anode region, an anode electrode connected to the anode region, and a cathode electrode connected to the cathode region. The i-type layer is normally formed by growing an epitaxial layer of low impurity concentration on the cathode region. The p-type anode region is formed by diffusing p type impurity into the i-type layer. Accordingly, the P-i-n diode has a profile of impurity concentration as shown in FIG. 1.

Some of the problems experienced with this type of prior art P-i-n diode include a high forward-voltage drop, on the order of 1 volt, the reverse-recovery time is quite long, for instance 200-300 nanoseconds, and the power loss of the device is high necessitating a radiator.

SUMMARY OF THE INVENTION

An object of this invention is to provide a low-loss P-i-n diode which has a low forward-voltage drop.

Another object of this invention is to provide a low-loss P-i-n diode which has a short reverse-recovery time.

Still another object of this invention is to provide a low-loss P-i-n diode which has a high reverse pulse surge capability.

In accordance with this invention, a P-i-n diode comprises a semiconductor substrate of one conductivity type, a first i-type layer of the one conductivity type formed on the semiconductor substrate, a second i-type layer of the one conductivity type formed on the first i-type layer, the impurity concentration of the second i-type layer being lower than that of the first i-type layer and carrier lifetime killer with a small carrier compensation effect being diffused into the first and second i-type layers, and finally a diffused layer of other conductivity type. The structure of the P-i-n diode is such that $Wi^2$ divided by $\tau$ falls in the range of 20 to 200/cm$^2$/sec. Wi represents the combined thickness of the first and second i-type layers less the thickness of the diffused layer and $\tau$ represents the carrier lifetime of the first and second i-type layers.

BRIEF DESCRIPTION OF THE DRAWINGS

This invention will be explained with reference to the accompanying drawings, in which.

DESCRIPTION OF THE PREFERRED EMBODIMENTS

Figure 1:
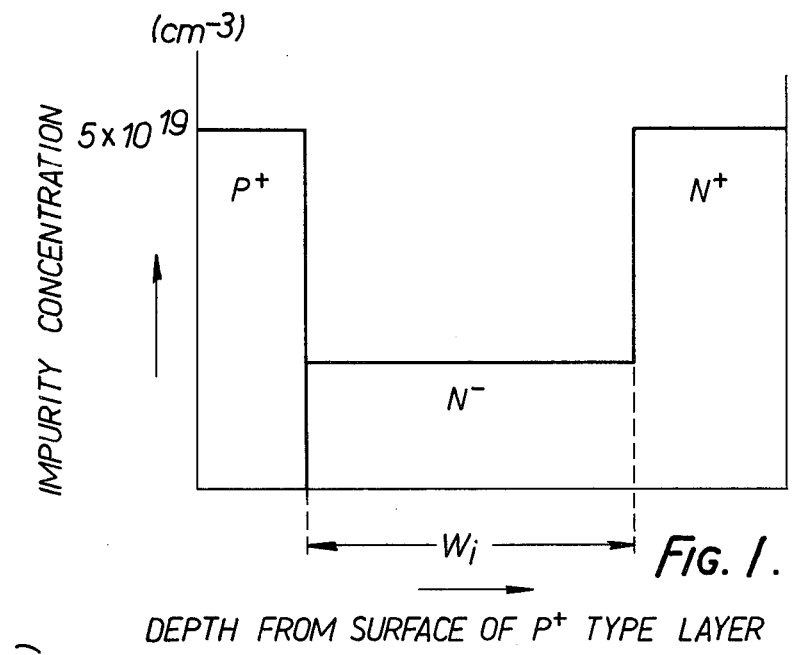
FIG. 1 is a profile showing impurity concentration characteristics plotted against the depth of the P-i-n diode.
Figure 2:
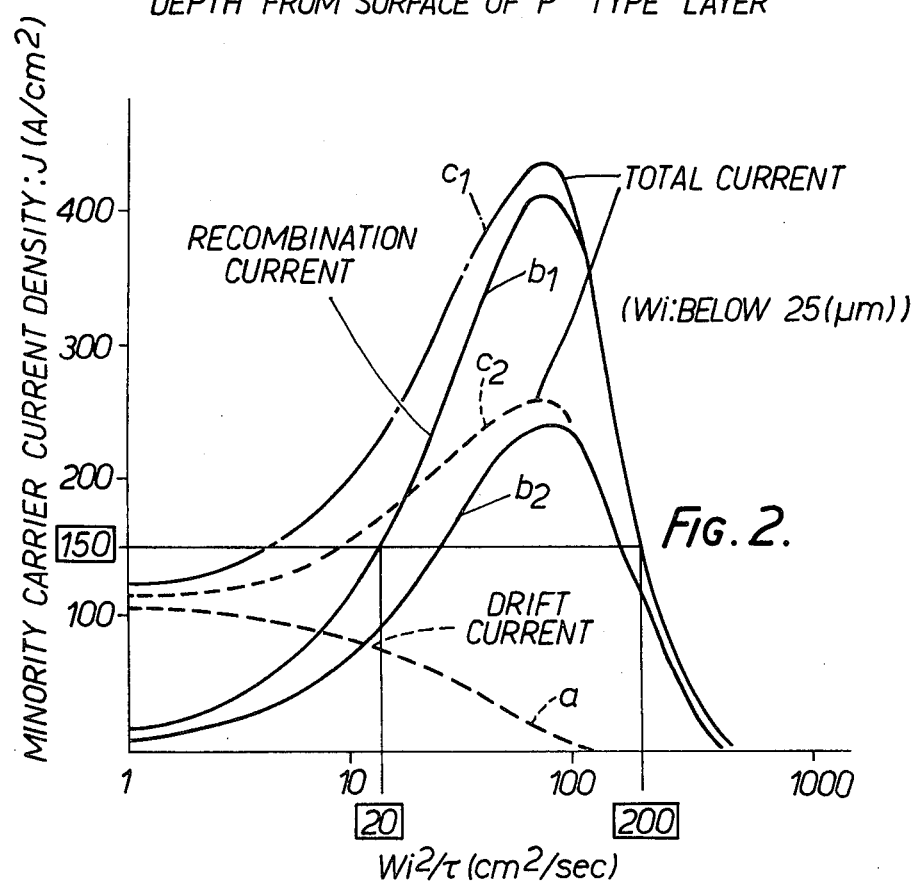
FIG. 2 shows forward-voltage drop $V_f$ as a function of $Wi^2/\tau$.

Referring now to FIGS. 1 and 2, an analysis of the operation of a P-i-n diode will be made.

Unless the current density is extremely high, current in both emitter regions of a P-i-n diode is primarily a diffusion current and not a drift current. As a result, the minority carrier currents $J_{pe}$ and $J_{ne}$ are given by the following expressions:

$$J_{pe} = q\sqrt{\frac{D_{pe}}{\tau_{pe}}} \; p, \text{ in } n \text{ emitter} \tag{1}$$

$$J_{ne} = q\sqrt{\frac{D_{ne}}{\tau_{ne}}} \; n, \text{ in } p \text{ emitter} \tag{2}$$

where $P_0$ and $n_0$ are the minority-carrier densities at the respective emitter edges; q is the unit charge $1.6 \times 10^{-19}$C; $D_{pe}$ and $D_{ne}$ are respectively the electron diffusion coefficient in the p emitter and the hole diffusion coefficient in the n emitter; and $\tau_{pe}$ and $\tau_{ne}$ are respectively the electron lifetime in the n emitter and the hole lifetime in the p emitter.

Total recombination current in the intrinsic region i is equal to the total change in electron or hole current density $J_{pi}$, $J_{ni}$ in the i region.

$$J_{pi} = J_{ni} = q \int_0^{W_i} \frac{n(x)p(x) - n_{i0}^2}{\tau_n(p(x) + n_{i0}) = \tau_p(n(x) + n_{i0})} dx \tag{3}$$

$$\cong \int_0^{W_i} q \frac{n(x)}{2\tau} dx$$

where the origin 0 of the x axis is located at the p-i interface junction and where $X = W_i$ is at the i-n interface junction. The ratio $n_{i0}/n$ is considered to be negligibly small, and the neutrality condition $n(x) = p(x)$ is assumed. For a short carrier lifetime less than 1 microsecond and relatively low current density levels below several hundred amperes, auger recombination can be neglected. Thus, the following equation holds:

$$n(0) \times n(W_i) = n_{i0}^2 \exp \frac{q}{kT} (V_F - V_i) \tag{4}$$

where $n(0)$ and $N(W_i)$ denote carrier densities at the p-i interface junctions respectively, and $V_i$ denotes the potential difference across the intrinsic region i. $p_0$ and $n_0$ are related to $n(0)$ and $n(W_i)$ as shown by the following expressions:

$$p_0 = \frac{n^2(W_i)}{N_n} h_n^2 \tag{5}$$

$$n_0 = \frac{n^2(0i)}{N_p} h_p^2 \tag{6}$$

where $N_n$ and $N_p$ denote impurity concentrations at the respective emitters and $h_p$ and $h_n$ denote the ratios of the p-n products between the respective emitter and the intrinsic region i. Heavy doping effects are taken into account by the h factors.

The simplifying approximation that n(x) is substantially constant throughout the intrinsic region i allows us to obtain a simple expression for $V_i$. This approximation holds if the carrier lifetime is long (ambipolar diffusion length $L \gtrsim W_i/2$) and both the geometrical symmetry of the p and n emitters and the asymmetry of carrier lifetime in the p and n emitters are insignificant. Under the above approximation, the total current $J_{pe} + J_{ni} + J_{ne}$ is equivalent to the drift current in the intrinsic region i. Thus, the following expression holds:

$$J_{pe} + J_{ni} + J_{ne} \cong q(\mu_n + \mu_p)nE_i \tag{7}$$

wherein $E_i$ is the electric field in the i region. Therefore, the voltage drop $V_i$ is given by $$V_i = E_i W_i = \tag{8}$$

$$\frac{W_i}{(\mu_n + \mu_p)} \left( \sqrt{\frac{D_{pe}}{\tau_{pe}} \frac{h_n^2}{N_n}} \, n + \sqrt{\frac{D_{ne}}{\tau_{ne}} \frac{h_n^2}{N_n}} \, n + \frac{W_i}{2} \right)$$

Under the above assumption of relatively low current density level and short carrier lifetime, the first two terms in equation (8) can be neglected. For a P-i-n diode having a narrow intrinsic region $W_i$, this assumption is valid regardless of the length of the carrier lifetime. This is due to the fact that the contribution to the value of $V_i$ of the first two terms is extremely small.

Finally, the total current density J is given by the following equation:

$$J = q \left( \sqrt{\frac{D_{ne}}{\tau_{ne}} \frac{h_n^2}{N_p} + \frac{D_{pe}}{\tau_{pe}} \frac{h_n^2}{N_n}} \right) n^2 + q \frac{W_i}{2\tau} n \tag{9}$$

$$n = n_{i0} \exp \frac{q}{2kT} \left( V_F - \frac{W_i}{4\mu_i \tau} \right) \tag{10}$$

$$\mu_i = \frac{1}{2}(\mu_p + \mu_n). \tag{11}$$

The first term in equation 9 is a diffusion current term while the second is a recombination current term. As can be seen in FIG. 2, the recombination current term for a constant voltage $V_F$ is generally inversely proportional to $\tau$ and reaches a maximum value at $$\tau_0 = \left( \frac{q}{kT} \right) \frac{W_i^2}{8\mu_i} \tag{12}$$

Below the value $\tau_0$, the recombination current decreases exponentially accompanying the decrease in n.

However, the diffusion current for a constant voltage $V_F$ almost always decreases with a decrease in $\tau$ because $\tau_{ne}$ and $\tau_{pe}$ are determined by the high impurity in the respective emitters in equation 1 for relatively high $\tau$ values.

Equation 9 can be rewritten as a function of $W_i^2/\tau$ and $1/W_i$ as follows:

$$J = \left( \frac{A}{\sqrt{\tau_{ne}}} + \frac{A'}{\sqrt{\tau_{pe}}} \right) \left[ n \left( \frac{W_i^2}{\tau} \right) \right]^2 + \tag{13}$$

$$\frac{q}{2} \cdot \frac{1}{W_i} \times \frac{W_i^2}{\tau} \times n \left( \frac{W_i^2}{\tau} \right)$$

Generally, the latter recombination term is dominant when the carrier density n and the current density are small. For the following analysis, we assume that the value for $W_i^2/\tau$ is kept constant. For a diode with a sufficiently narrow intrinsic region $W_i$, the recombination current will be dominant even for high current density levels. This is because the current changes proportionally to $1/W_i$.

Therefore, the total current at a constant voltage reaches its maximum at $W_i^2/\tau_0 = 8\mu_i kT/q$. This is also the point that the recombination current reaches its maximum. In other words, the forward-voltage for a constant current will have its minimum at $W_i^2/\tau_0 = 8\mu_i kT/q$. As discussed before, the recombination current in the P-i-n diode which has a narrow thickness $W_i$ of the intrinsic layer is 10 times as much as the drift current. For example, in FIG. 2 the current density characteristics as a function of $W_i^2/\tau$ is shown where $V_F = 0.85$ V, $W_i = 10$ m or $W_i = 17$ m, $\mu_1 = 400/\text{cm}^2/\text{V.sec}$, $n_0 = 1.2 \times 10^{10}/\text{cm}^3$, $T = 300K$, $\tau_{ne} = \tau_{pe} = 5 \times 10^{-8}$ sec, $h_n = h_p = 10$, $D_{ne} = D_{pe} = 2$ cm$^2$/sec, and $N_n = N_p = 5 \times 10^{19}/\text{cm}^3$. The solid line curve "a" shows the diffusion current. The solid line curves "b$_1$" and "b$_2$" show the recombination current when $W_i = 10$ m and $W_i = 17$ m, respectively. The dotted line curves "c$_1$" and "c$_2$" show total current for the two cases respectively.

Figure 3:
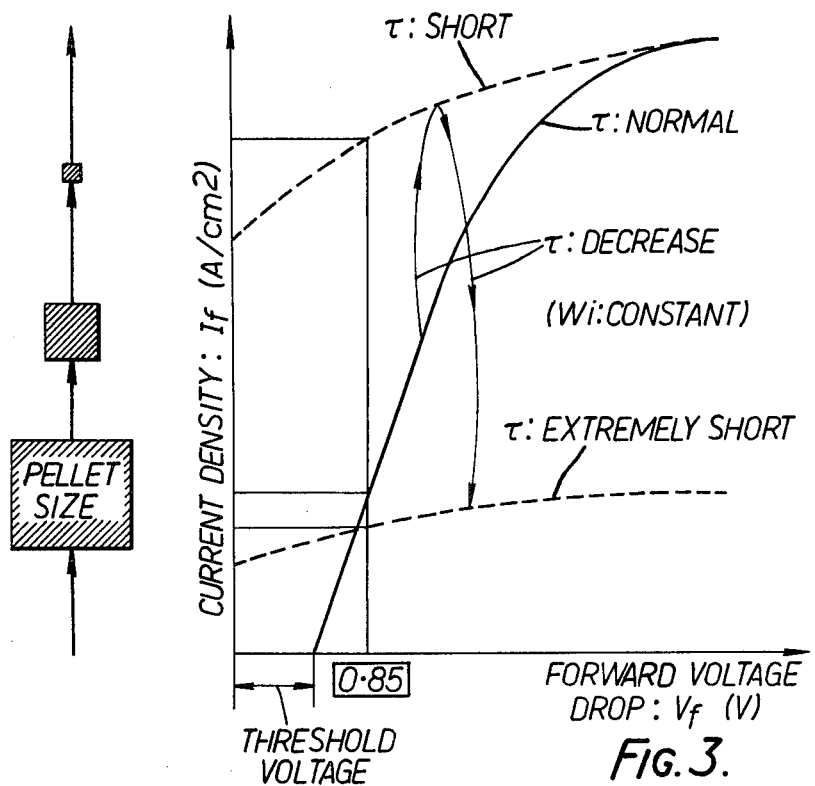
FIG. 3 shows forward-voltage drop $V_f$ as a function of current density $I_f$ for varying carrier lifetimes $\tau$.

As shown in FIG. 3, it is clear that by increasing the semiconductor pellet size the forward-voltage drop of a P-i-n diode can be decreased. In FIG. 3 the characteristic of the current density ($I_f$) and the forward-voltage drop ($V_f$) is shown.

However, since the current density $I_f$ is proportional to the reciprocal to the semiconductor pellet area, it also becomes necessary to greatly increase the pellet size in order to decrease the forward-voltage drop.

Therefore, in accordance with the present invention, measures can be taken to decrease the forward-voltage drop $V_f$ without unnecessarily increasing the semiconductor pellet size. In particular, a relatively small forward-voltage drop is obtained by selecting a suitable value for the term $W_i^2/\tau$ as is obvious from FIG. 4.

Figure 4:
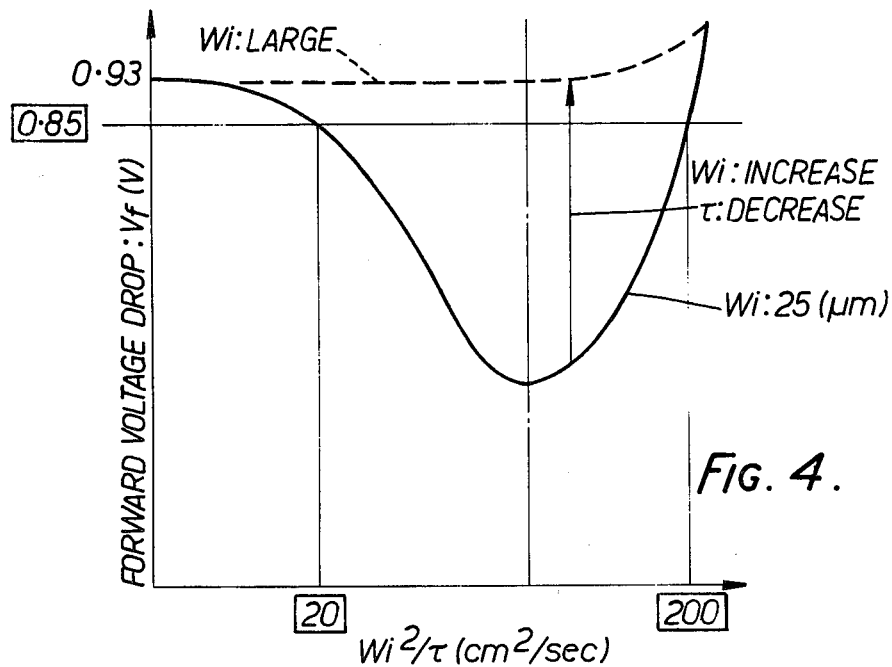
FIG. 4 shows minority-carrier current density J as a function of $Wi^2/\tau$.
Figure 6:
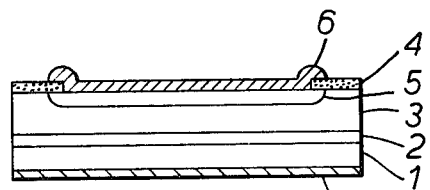
FIG. 6 is a sectional view showing the structure of a low-loss P-i-n diode of this invention.

Referring now to FIG. 4, there is shown the case where the value of $W_i$ (thickness of the i-type epitaxial layer less the thickness of the p-type anode region as shown in FIG. 6) is equal to 25 $\mu$m. In this case, the value of the forward-voltage drop $V_f$ can be changed without varying the semiconductor pellet size. This is so only in those cases when the value of $W_i$ is not large. When $W_i$ is large the forward-voltage drop $V_f$ is substantially constant for varying values of $W_i^2/\tau$ as shown by the dotted line in FIG. 4. When $W_i$ is very large, the forward-voltage drop is not controlled by the value of the carrier lifetime $\tau$ because the drift current increases significantly in comparison with the recombination current. Therefore, the total current, i.e., the combination of drift and recombination currents, is not affected significantly by the value of $\tau$. In the case of $\tau$ an extremely short lifetime as shown in FIG. 3, the current density $I_f$ is also not significantly influenced by the value of the forward-voltage drop $V_f$.

FIG. 4 shows that in the range for $W_1^2/\tau$ of 20–200 cm²/sec the value of the forward-voltage drop $V_f$ can be significantly decreased and indeed optimized. The phenomenon in which minority carrier current density $J$ changes with $W_i^2/\tau$ is also shown by FIG. 2. FIG. 3 shows that the required recombination current is obtained when $W_i$ is less than 25 μm and $W_i^2/\tau$ lies in the range from 20 to 200 cm²/sec. A typical current density $J$ is 150 A/cm² which is shown in FIG. 2 where $W_i^2/\tau$ is selected in the range of 20–200 cm²/sec.

Another consideration in the design of a P-i-n diode is the reverse pulse surge capability of the diode. For instance, in a switching regulator using a P-i-n diode, a spike voltage from a primary coil is often applied to the diode connected to the secondary of the switching regulator. In this type of situation the P-i-n diode must be capable of withstanding a reverse pulse surge. At the same time, it is necessary to diffuse a carrier lifetime killer to obtain a value for $W_i^2/\tau$ which lies between 20–200 cm²/sec. Such a higher concentration causes an increase in resistivity due to the carrier compensation effect. If the change in resistivity is too large, the depletion layer will extend beyond the thickness of the i layer; that is, a punch-through effect will occur. Therefore, such a diode will have a small reverse pulse surge capability.

This problem is alleviated by the present invention as will be shown in the subsequent discussion. In FIG. 6, a preferred embodiment of the present invention is shown. A low-loss P-i-n diode 10 includes an n+-type anode layer 1, respective i-type epitaxial layers 2 and 3, a p-type cathode region 5, an anode electrode 7 connected to the anode layer 1 and a cathode electrode 6 connected to the cathode region 5. The i-type epitaxial layer consists of a first i-type region 2 and a second i-type region 3, the second i-type region 3 having a lower impurity concentration than that of the first i-type region 2. A carrier lifetime killer, for example platinum (Pt), is diffused into the i-type epitaxial layers 2 and 3 to control the carrier lifetime.

In the embodiment of FIG. 6, platinum (Pt) is a desirable element to use as a carrier lifetime killer since it does not increase the resistivity to the degree that gold (Au) would. $W_i$ and $\tau$ are chosen to satisfy the following equation:

$$W_i^2/\tau = 20 \sim 200 [cm^2/sec]$$

Figure 5:
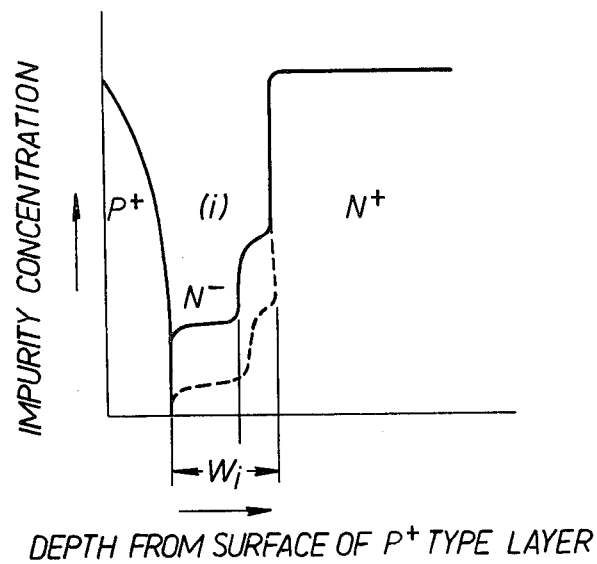
FIG. 5 shows a profile of the impurity concentration characteristics as a function of depth of the low-loss P-i-n diode in accordance with this invention.

The P-i-n diode of FIG. 4 has an impurity concentration profile as shown in FIG. 5. In FIG. 5, the solid line shows a profile of the i-type layer using platinum (Pt) as the lifetime killer and the dotted line curve represents the impurity concentration profile of the i-type layer when gold is diffused as a lifetime killer. Also the impurity concentration of the first i-type region 2 is higher than that of the second i-type region 3. Therefore, the depletion layer ends at the first i-type region 2.

Therefore, the P-i-n diode of FIG. 4 with an impurity concentration profile as shown in FIG. 5 will have a good reverse pulse surge capability. Permanent destruction to the P-i-n diode due to punch-through will not occur. With the present invention as depicted in the embodiment of FIG. 4 a low forward-voltage drop is obtained, the reverse-recovery time is shortened and the reverse pulse surge capability is extremely high. Typical values using the present invention are a forward-voltage drop of 0.86 volts, a reverse-recovery time of 50–60 nanosec and a reverse pulse surge capability of 800 volts.

Figure 7A:
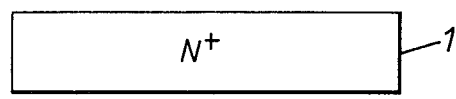
FIGS. 7A–7G show the process steps for manufacturing a low-loss P-i-n diode as shown in FIG. 6.
Figure 7B:
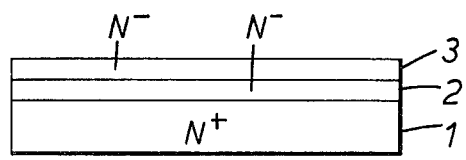

Referring now to FIGS. 7A–7G, the steps of manufacturing a P-i-n type diode in accordance with the present invention will be described. On an n+-type semiconductor substrate 1 as shown in FIG. 7A, an epitaxial region 2 having a resistivity of approximately 5 ohms and a thickness $W_1$ of approximately 5 μm is formed. A second epitaxial region 3 is formed on the first i-type region 2, the second epitaxial region having a lower impurity concentration than that of the first i-type region 2. The thickness $W_2$ of the second epitaxial region is approximately 20 μm.

Figure 7C:
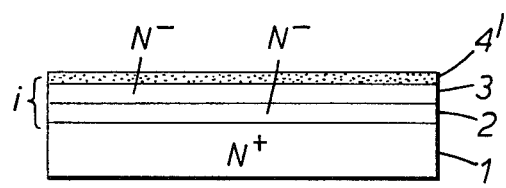
Figure 7D:
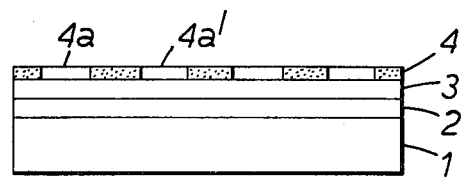
Figure 7E:
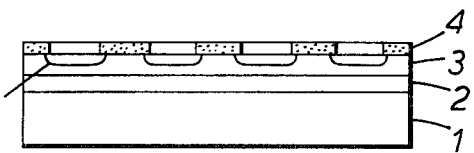
Figure 7F:
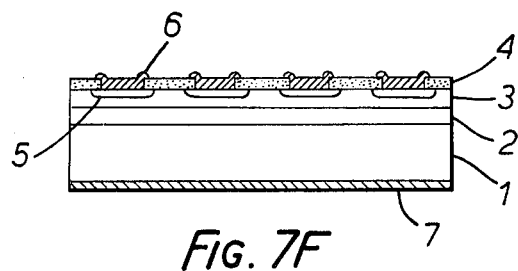
Figure 7G:
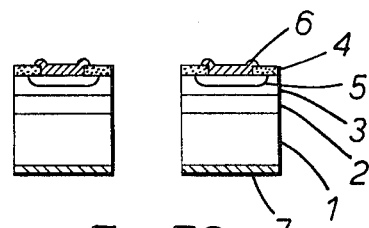

A thermal oxide layer 4' is then formed on the second i-type region 3 as a masking layer which is then selectively etched away so as to provide apertures 4A, 4A' . . . as shown in FIGS. 7C and 7D. A p-type impurity such as boron is diffused into the second i-type region 3 through the apertures 4A, 4A' . . . to form a plurality of p+ regions 5 having a thickness $W_2$ of approximately 5 μm as shown in FIG. 7E. The thickness $W_i = W_1 + W_2 - W_3$. Platinum (Pt) as a lifetime killer is diffused into the first and second i-type regions to control the carrier lifetime. For instance, it can be set at $10^{-7} - 10^{-8}$ sec above 900° C. Anode and cathode electrodes 7 and 6 respectively, are formed on the p+ region and the n+ region 1 as shown in FIGS. 7F and 7G. The wafer is then separated into pellets 10, 10', etc.

In the present invention, the permanent destruction which is possible due to excessive surge voltage is prevented by providing the second i-type layer having a lower impurity concentration than the first i-type layer. This construction prevents the punch-through phenomenon.

In accordance with the present invention a high reverse breakdown voltage, for instance above 200 volts and a small forward-voltage drop of for instance 0.85 volts, can be obtained with a very short recovery time of 50–60 nsec.

Figure 8:
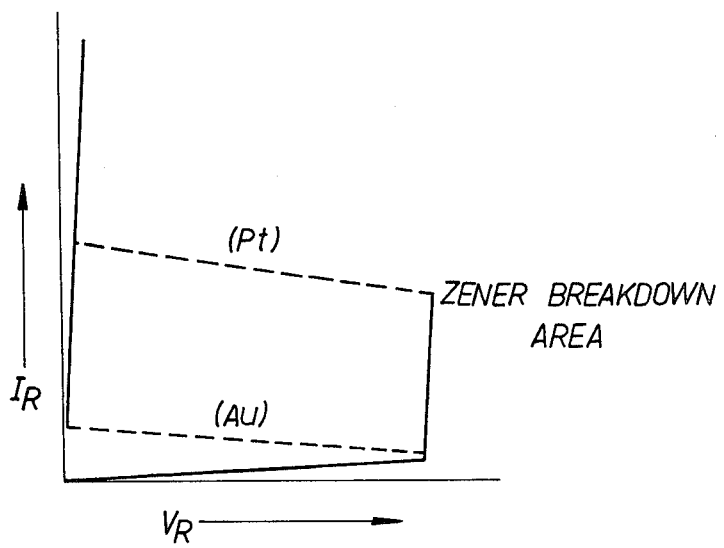
FIG. 8 is a profile showing the reverse current $I_R$ characteristics with reverse-voltage $V_R$ for gold (Au) and platinum (Pt).

FIG. 8 shows the profile of the $I_R$-$V_R$ characteristics for P-i-n diode using respectively, gold and platinum as the diffused lifetime killer. The different effects on the resistivity of the diode can be seen.

Although this invention has been disclosed with reference to a particular preferred embodiment, the principles involved are capable of other applications which will be apparent to those skilled in the art. The invention is therefore not to be limited to the above disclosure but only as indicated by the scope of the claims to follow.

What we claim is:

1. A P-i-n diode comprising:
   a semiconductor substrate of a first conductivity type which functions as the anode of the P-i-n diode;
   a first i-type layer of said first conductivity type formed on said semiconductor substrate and having a first thickness $W_1$;
   a second i-type layer of said first conductivity type formed on the first i-type layer and having a second thickness of $W_2$;
   said second i-type layer having an impurity concentration lower than that of said first i-type layer;
   carrier lifetime killer characterized by a small carrier compensation effect being diffused into said first and second i-type layers whereby said first and second i-type layers have a carrier lifetime of $\tau$; and a region of second conductivity type diffused into said second i-type layer and having a thickness of $W_3$ which functions as the cathode of the P-i-n diode.

2. The P-i-n diode of claim 1 wherein $W_i^2/\tau$ is in the range of 20–200 cm$^2$/sec where $W_i$ equals $W_1+W_2-W_3$.

3. The P-i-n diode as claimed in claim 1 wherein the carrier lifetime killer is platinum.

4. The P-i-n diode as claimed in claim 1 wherein the thickness $W_1$ of the first i-type layer is less than 5 μm.

5. The P-i-n diode as claimed in claim 1 wherein the thickness $W_2$ of the second i-type layer is approximately 25 μm.